(12) United States Patent
Yamamura et al.

(10) Patent No.: US 6,727,035 B2
(45) Date of Patent: Apr. 27, 2004

(54) PHOTOCURABLE LIQUID RESIN COMPOSITION

(75) Inventors: Tetsuya Yamamura, Umezono (JP); Akira Takeuchi, Kawaguchi (JP); Tsuyoshi Watanabe, Morigayama (JP); Takashi Ukachi, Kamiya (JP)

(73) Assignees: DSM N.V., Heerlen (NL); JSR Corporation, Tokyo (JP); Japan Fine Coatings Co., Ltd., Tokyo (JP)

( * ) Notice: Subject to any disclaimer, the term of this patent is extended or adjusted under 35 U.S.C. 154(b) by 0 days.

(21) Appl. No.: 09/924,116

(22) Filed: Aug. 8, 2001

(65) Prior Publication Data

US 2002/0048717 A1 Apr. 25, 2002

Related U.S. Application Data

(63) Continuation of application No. 09/252,239, filed on Feb. 18, 1999, now Pat. No. 6,287,745.

(30) Foreign Application Priority Data

Feb. 18, 1998 (JP) .......................................... 10-052729
Feb. 24, 1998 (JP) .......................................... 10-022498
Feb. 24, 1998 (JP) .......................................... 10-058862
Feb. 26, 1998 (JP) .......................................... 10-62090

(51) Int. Cl.$^7$ .......................... C08F 7/028; C08F 7/004; C08L 63/00
(52) U.S. Cl. ..................... 430/269; 430/280.1; 522/114; 522/116; 522/121; 522/129
(58) Field of Search ........................... 430/269, 280.1, 430/270.1, 281.1; 522/114, 116, 120, 121, 129, 170, 168, 169, 172, 149

(56) References Cited

U.S. PATENT DOCUMENTS

| | | |
|---|---|---|
| 4,428,807 A | 1/1984 | Lee |
| 5,002,854 A | 3/1991 | Fan et al. |
| 5,453,450 A | 9/1995 | Kinzer et al. |
| 5,476,748 A | 12/1995 | Steinmann |
| 5,545,367 A | 8/1996 | Bae et al. |
| 5,827,575 A | 10/1998 | Kasari et al. |
| 5,981,616 A | 11/1999 | Yamamura et al. |
| 5,985,510 A | 11/1999 | Akutsu et al. |
| 6,054,250 A | 4/2000 | Sitzmann et al. |
| 6,096,796 A * | 8/2000 | Watanabe et al. ............ 522/100 |
| 6,099,787 A * | 8/2000 | Melisaris et al. ............ 264/401 |
| 6,100,007 A * | 8/2000 | Pang et al. .................. 430/269 |
| 6,127,085 A * | 10/2000 | Yamamura et al. .......... 430/177 |
| 6,136,497 A * | 10/2000 | Melisaris et al. ............ 430/269 |
| 6,287,745 B1 * | 9/2001 | Yamamura et al. .......... 430/269 |
| 6,350,403 B1 * | 2/2002 | Melisaris et al. ............ 264/401 |
| 6,413,696 B1 * | 7/2002 | Pang et al. ............... 430/280.1 |

FOREIGN PATENT DOCUMENTS

| | | |
|---|---|---|
| CA | 2211628 | 1/1998 |
| EP | 848292 | 6/1998 |
| EP | 0 848 293 A1 * | 6/1998 |
| WO | 97/38354 | 10/1997 |

OTHER PUBLICATIONS

Yamamura et al, U.S. patent application Publication 2002/0132872 A1, Sep. 19, 2002.*

* cited by examiner

Primary Examiner—Susan Berman
(74) Attorney, Agent, or Firm—Pillsbury Winthrop LLP

(57) ABSTRACT

The present invention relates to a photocurable liquid resin composition comprising: (A) a cationically polymerizable organic compound; (B) a cationic photopolymerization initiator; (C) an ethylenically unsaturated monomer; (D) a radical photopolymerization initiator; (E) a polyether polyol compound having one or more hydroxyl groups in one molecule; and, optionally, includes elastomer particles having a specific particle diameter and/or an epoxy-branched alicyclic compound.

20 Claims, 2 Drawing Sheets

PHOTOCURABLE LIQUID RESIN COMPOSITION

CROSS-REFERENCE TO RELATED APPLICATION

This is a Continuation of application Ser. No. 09/252,239 filed Feb. 18, 1999.

The contents of Japanese Application No. JP 98-52729, filed Feb. 18, 1998;Japanese Applications No. JP 98-58861, and JP 98-58862, both filed Feb. 24, 1998; and Japanese Application JP 98-62090, filed Feb. 26, 1999 now U.S. Pat. No. 6,287,745 are hereby incorporated in their entirety by reference.

FIELD OF THE INVENTION

The present invention relates to a photocurable liquid resin composition exhibiting superior photocurability and capable of producing a cured product exhibiting high mechanical strength. More particularly, the present invention relates to a photocurable resin composition suitably used as a coating material for plastics, various films, wood, ceramic wares, glass, quartz fibers for optical communication, papers, metals, cans for drinks, fibers, and the like, a resin for photofabrication of three-dimensional objects, sealing materials or adhesives for semi-conductor devices, under fill materials, adhesives for optical materials, printing board materials, and the like. In particular, when said composition is used as a resin for photofabrication of three-dimensional objects, the composition exhibits high photocurability by exposure to various light sources such as a laser and an UV lamp, and the resulting cured three-dimensional objects exhibit excellent impact resistance and superior folding endurance.

BACKGROUND OF THE INVENTION

In recent years, photofabrication of three-dimensional objects consisting of cured resin layers integrally laminated by repeating a step of selectively irradiating a photocurable liquid material (photocurable resin composition) has been proposed (see Japanese Patent Applications Laid-open No. 247515/1985, U.S. Pat. No. 4,575,330, No. 35966/1987, No. 101408/1987, and No. 24119/1993).

A typical example of the above photofabrication process is as follows. A cured resin layer having a specified pattern is formed by selective exposure to radiation such as from an ultraviolet laser on the surface of the photocurable resin composition in a vessel. An amount of the photocurable resin composition equivalent to another layer is then provided over this cured resin layer followed by selective irradiation to the liquid surface to form a new cured resin layer integrally laminated over the primary layer. The above step using the same or different irradiated patterns is repeated certain times to obtain a three-dimensional object consisting of a plural integrally-laminated cured resin layer. This photofabrication process has attracted considerable attention, since three-dimensional objects having a complicated shape can be easily formed in a short time by using this process.

As the photocurable resin composition used in this photofabrication of three-dimensional objects, the following resin compositions (a) to (c) have been conventionally proposed:

(a) a resin composition containing a radically polymerizable organic compound such as urethane (meth)acrylate, oligoester (meth)acrylate, epoxy (meth)acrylate, thiol, ene compound, and photosensitive polyimide (see, for example, Japanese Patent Applications Laid-open No. 204915/1989, No. 208305/1990, and No. 160013/1991);

(b) a resin composition containing a cationically polymerizable organic compound such as an epoxy compound, cyclic ether compound, cyclic lactone compound, cyclic acetal compound, cyclic thioether compound, spiro orthoester compound, and vinyl ether compound (see, for example, Japanese Patent Application Laid-open No. 213304/1989); and (c) a resin composition containing both a radically polymerizable organic compound and a cationically polymerizable organic compound (see, for example, Japanese Patent Applications Laid-open No. 28261/1990, No. 75618/1990, and No. 228413/1994).

In view of efficiency of the photofabrication, the photocurable resin composition used in the photofabrication is required to exhibit low viscosity for immediately forming a smooth liquid surface and high curability by exposure to radiation, and the resulting cured product consisting of the three-dimensional objects is required to exhibit no swelling and minimal deformation such as warping, indentation, and overhanging of the stretched part caused by shrinkage during curing by exposure to radiation. Moreover, superior stability with time of these mechanical properties are required for such objects.

The three-dimensional objects formed by the photofabrication are used for design models, prototypes of mechanical parts, and the like. In particular, when these three-dimensional objects are used for prototypes of mechanical parts, such objects have to be formed by high-precision microfabrication conforming to specified procedures and exhibit sufficient mechanical strength, superior heat resistance, and excellent waterproofing characteristics under use conditions.

However, no conventional resin composition can satisfy the above demands. Three-dimensional objects formed by photofabricating the above-described conventional resin compositions exhibited deformation with time such as warping, indentation, and overhanging of the stretched part due to residual distortion caused by the shrinkage during curing. When the resin composition (a) containing a radically polymerizable organic compound such as urethane (meth)acrylate, oligoester (meth)acrylate, epoxy (meth)acrylate, thiol, ene compound, and photosensitive polyimide is used as the photocurable resin, although the resulting three-dimensional objects exhibit relatively excellent mechanical properties, it has been pointed out that further improvements are required to minimize inaccuracy of fabrication and variation with time of the fabricated forms (Journal of Fabrication, vol. 9, No. 5, pp. 330–335, 1997). In order to increase accuracy of fabrication, a method for controlling phototransmission depth of the resin composition by blending core-shell composite polymer particles (see Japanese Patent Application Laid-open No. 114733/1991) or particles consisting of polarizing materials having a refractive index essentially differing from that of the resin composition (see Japanese Patent Application Laid-open No. 103415/1991) by utilizing diffusion of light has been proposed. However, sufficient accuracy of fabrication has not been achieved by using such a method.

When the resin composition (b) containing a cationically polymerizable organic compound such as an epoxy compound, cyclic ether compound, cyclic lactone compound, cyclic acetal compound, cyclic thioether compound, spiro orthoester compound, and vinyl ether compound is used as the photocurable resin, fabrication cannot be carried out efficiently due to insufficient curablity of the composition. The three-dimensional objects formed from the resin composition (b) exhibit relatively higher accuracy of fabrication. However, because mechanical properties of the resulting three-dimensional objects deteriorate with time depending on the working conditions (temperature and humidity), such objects cannot be used under the conditions where long-term mechanical strength is required. Moreover, it has been pointed out that these objects cannot be used practically as functional parts because of insufficient mechanical strength, in particular, insufficient toughness such as low impact resistance and low folding endurance.

In view of the above situation, the resin composition (c) containing both a radically polymerizable organic compound and a cationically polymerizable organic compound has been proposed. Although curability of the composition is improved to a certain extent, the objects formed from the composition cannot be used in practice because of inadequate mechanical properties, in particular, insufficient toughness.

In order to provide three-dimensional objects with mechanical strength, toughness in particular, a resin composition containing microparticles with a specific gravity differing from that of the resin composition in a range within 0.2 has been proposed (see Japanese Patent Application Laid-open No. 145616/1990). In spite of increased toughness of the resulting three-dimensional objects, such objects exhibited weak folding endurance during repeated foldings when used as functional parts.

The present invention has been achieved based on the above situation.

An object of the present invention is to provide a novel photocurable liquid resin composition.

A second object of the present invention is to provide a photocurable liquid resin composition used for photofabrication of three-dimensional objects which exhibit superior mechanical strength and high dimensional accuracy and are suitably used as prototypes for mechanical parts and the like.

A third object of the present invention is to provide a photocurable liquid resin composition used for photofabrication of three-dimensional objects exhibiting small deformation with time.

A fourth object of the present invention is to provide a photocurable liquid resin composition used for photofabrication of three-dimensional objects exhibiting small variation of mechanical properties with time.

A fifth object of the present invention is to provide a photocurable liquid resin composition used for photofabrication of three-dimensional objects exhibiting superior mechanical properties, in particular, high toughness such as high impact resistance.

A sixth object of the present invention is to provide a photocurable liquid resin composition used for photofabrication of three-dimensional objects exhibiting high folding endurance.

A further object of the present invention includes those wherein the photofabrication composition is transparent before cure and/or after cure.

SUMMARY OF THE INVENTION

The above objects can be achieved by the photocurable liquid resin composition of the present invention comprising:

(A) a cationically polymerizable organic compound;

(B) a cationic photopolymerization initiator;

(C) an ethylenically unsaturated monomer;

(D) a radical photopolymerization initiator; and (E) a polyether polyol compound having one or more hydroxyl groups in one molecule.

Figure 1:
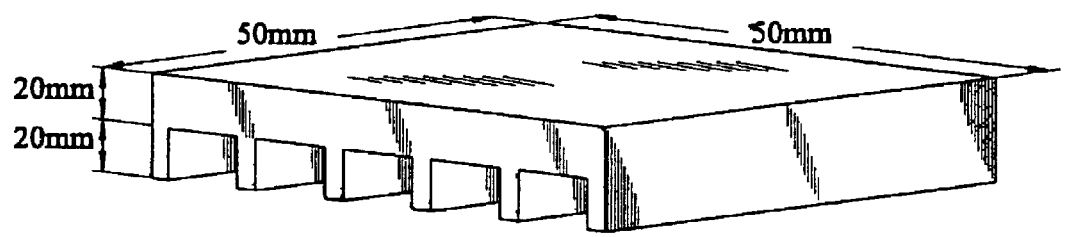
FIG. 1 is a perspective view of a a three-dimensional model used for measuring the deformation with respect to time of the cured products formed from the photocurable compositions of Examples and Comparative Examples.

EXPLANATION OF SYMBOLS IN FIG. 2.

10: warping model
11, 12: leg
20: horizontal stand

Cationically Polymerizable Organic Compound (A)

The cationically polymerizable organic compound (A) of the photocurable resin composition of the present invention (herein also called "component (A)") polymerizes or crosslinks by irradiation in the presence of cationic photopolymerization initiators.

The molecular weight of component (A) is between 120 and 10,000, preferably between 150 and 5,000, more preferably between 180 and 2,000.

Examples of such a compound include epoxy compounds, oxetane compounds, oxolane compounds, cyclic acetal compounds, cyclic lactone compounds, thiirane compounds, thiethane compounds, vinyl ether compounds, spiro orthoester compounds obtained by the reaction of an epoxy compound with at least one lactone compound, ethylenically unsaturated compound, cyclic ether compound, cyclic thioether compound, vinyl compound, and/or the like.

Preferred cationically polymerizable organic compounds include glycidyl ether compounds, including di-, tri- and polyglycidyl ether compounds, and alicyclic ether compounds including those comprising residue of carboxylic acids such as, for example, alkylcarboxylic acid residual groups, alkylcycloalkylcarboxylic acid residual groups and dialkyl dicarboxylic acid residual groups. Suitable epoxy compounds that can be used as component (A) include, for example, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)cyclohexane-1,4-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate,3,4-epoxy-6-methylcyclohexyl-3',4'-epoxy-6'-methylcyclohexanecarboxylate, methylenebis(3,4-epoxycyclohexane), dicyclopentadiene diepoxide, di(3,4-epoxycyclohexylmethyl)ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6- hexanediol diglycidyl ether, glycerol triglycidyl ether, trimethylolpropane triglycidyl ether, polyethylene glycol diglycidyl ether, polypropylene glycol diglycidyl ether, polyglycidyl ethers of polyether polyol obtained by the addition of one or more alkylene oxides to aliphatic polyhydric alcohols such as ethylene glycol, propylene glycol, and glycerol, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, and the like can be given.

Examples of other cationically polymerizable organic compounds which can be used as the component (A) include oxetanes such as trimethylene oxide, 3,3-dimethyloxetane, 3,3-dichloromethyloxetane, 3-ethyl-3-phenoxymethyloxetane, and bis(3-ethyl-3-methyloxy)butane; oxolanes such as tetrahydrofuran and 2,3-dimethyltetrahydrofuran; cyclic acetals such as trioxane, 1,3-dioxolane, and 1,3,6-trioxanecyclooctane; cyclic lactones such as β-propyolactone and ε-caprolactone; thiiranes such as ethylene sulfide, 1,2-propylene sulfide, and thioepichlorohydrin; thiethanes such as 3,3-dimethylthiethane; vinyl ethers such as ethylene glycol divinyl ether, triethylene glycol divinyl ether, trimethylolpropane trivinyl ether; spiro orthoesters obtained by the reaction of an epoxy compound and lactone; ethylenically unsaturated compounds such as vinylcyclohexane, isobutylene, and polybutadiene; derivatives of the above compounds; and the like.

Of these cationically polymerizable organic compounds, bisphenol A diglycidyl ether, bisphenol F diglycidyl ether, hydrogenated bisphenol A diglycidyl ether, hydrogenated bisphenol F diglycidyl ether, 3,4-epoxycyclohexylmethyl-3',4'-epoxycyclohexanecarboxylate, bis(3,4-epoxycyclohexylmethyl)adipate, 1,4-butanediol diglycidyl ether, 1,6-hexanediol diglycidyl ether, glycerol triglycidyl ether, trimethylolpropane triglycidyl ether, neopentyl glycol diglycidyl ether, polyethylene glycol diglycidyl ether, and polypropylene glycol diglycidyl ether are preferable.

As even more preferred cationically polymerizable organic compounds used as the component (A), epoxy compounds having two or more alicyclic epoxy groups in a molecule such as 3,4-epoxycyclohexylmethyl-3',4'-epoxycyclohexanecarboxylate, and bis(3,4-epoxycyclohexylmethyl)adipate can be given.

As examples of commercially available products of the cationically polymerizable organic compounds suitably used as the component (A), UVR-6100, UVR-6105, UVR-6110, UVR-6128, UVR-6200, UVR-6216 (manufactured by Union Carbide Corp.), Celoxide 2021, Celoxide 2021P, Celoxide 2081, Celoxide 2083, Celoxide 2085, Celoxide 2000, Celoxide 3000, Glycidole, AOEX 24, Cyclomer A200, Cyclomer M100, Epolead GT-300, Epolead GT-301, Epolead GT-302, Epolead GT-400, Epolead 401, Epolead 403 (manufactured by Daicel Chemical Industries, Ltd.), Epicoat 828, Epicoat 812, Epicoat 1031, Epicoat 872, Epicoat CT508 (manufactured by Yuka-Shell Epoxy K.K.), KRM-2100, KRM-2110, KRM-2199, KRM-2400, KRM-2410, KRM-2408, KRM-2490, KRM-2200, KRM-2720, KRM-2750 (manufactured by Asahi Denka Kogyo Co., Ltd.), Rapi-Cure DVE-3, CHVE, PEPC (manufactured by ISP), VECTOMER 2010, 2020, 4010, 4020 (manufactured by AlliedSignal), and the like can be given.

Component (A) may comprise a single type of cationically polymerizable compound or include combinations of two or more cationically polymerizable compounds.

The proportion of the component (A) used in the photocurable resin composition of the present invention is usually, relative to the total compositon, 20–85 wt %, preferably 30–80 wt %, and more preferably 40–75 wt %. If the proportion is too small, three-dimensional objects formed from the resin composition may exhibit insufficient dimensional accuracy and deformation with time may be caused. On the other hand, if the proportion is too large, the resin composition may exhibit inferior photocurability which may result in inefficient fabrication.

Cationic Photopolymerization Initiator (B)

The cationic photopolymerization initiator of the photocurable resin composition of the present invention (herein also called "component (B)") evolves a material which initiates cationically polymerization of the component (A) by exposure to energy rays such as radiation. Here, energy rays such as radiation include visible rays, ultraviolet rays, infrared rays, X-ray, α-rays, β-rays, γ-rays, and the like. As examples of preferable compounds used as the component (B), onium salts represented by formula (1) can be given:

wherein a cation is an onium ion; W represents S, Se, Te, P, As, Sb, Bi, O, I, Br, Cl, or —N≡βN; $R^1$, $R^2$, $R^3$, and $R^4$ independently represent organic groups; a, b, c, and d independently represent integers from 0–3, provided that the total of (a+b+c+d) is equal to the of valence of W; M is a metal or a metalloid which constitutes a center atom of the halide complex [$MX_{n+m}$] for example, M represents B, P, As, Sb, Fe, Sn, Bi, Al, Ca, In, Ti, Zn, Sc, V, Cr, Mn, Co; X represents a halogen atom such as F, Cl, and Br; m represents a positive charge of a halide complex ion; and n represents a valence of M. This onium salt evolves Lewis acids by irradiation.

As specific examples of an anion [$MX_{n+m}$] in the above formula (1), tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), and the like can be given.

Moreover, onium salts having an anion represented by the formula [$MX_n(OH)^-$] and onium salts having other anions such as perchloric acid ion ($ClO_4^-$), trifluoromethane sulfonic acid ion ($CF_3SO_3^-$), fluorosulfonic acid ion ($FSO_3^-$), toluenesulfonic acid ion, trinitrobenzenesulfonic acid anion, trinitrotoluenesulfonic acid anion can also be used.

Of these onium salts, aromatic onium salts are more preferable as the component (B). Examples of such aromatic onium salts include: aromatic halonium salts disclosed in, for example, Japanese Patent Applications Laid-open No. 151996/1975 and No. 158680/1975, VIA group aromatic onium salts disclosed in, for example, Japanese Patent Applications Laid-open No. 151997/1975, No. 30899/1977, No. 55420/1981, and No. 125105/1980; VA group aromatic onium salts disclosed in, for example, Japanese Patent Application Laid-open No. 158698/1975; oxosulfoxonium salts disclosed in, for example, Japanese Patent Applications Laid-open No. 8428/1981, No. 149402/1981, and No. 192429/1982; aromatic diazonium salts disclosed in, for example, Japanese Patent Application Laid-open No. 17040/1974; thiopyrylium salts disclosed in, for example, U.S. Pat. No. 4,139,655; and the like. In addition, iron/allene complex initiators, aluminum complex/photolysis silicon compound initiators, and the like can also be given as examples.

As examples of commercially available products of cationic photopolymerization initiators suitably used as the component (B), UVI-6950, UVI-6970, UVI-6974, UVI-6990 (manufactured by Union Carbide Corp.), Adekaoptomer SP-150, SP-151, SP-170, SP-171 (manufactured by Asahi Denka Kogyo Co., Ltd.), Irgacure 261 (manufactured by Ciba Specialty Chemicals Co., Ltd.), CI-2481, CI-2624, CI-2639, CI-2064 (manufactured by Nippon Soda Co., Ltd.), CD-1010, CD-1011, CD-1012 (manufactured by Sartomer Co., Ltd.), DTS-102, DTS-103, NAT-103, NDS-103, TPS-103, MDS-103, MPI-103, BBI-103 (manufactured by Midori Chemical Co., Ltd.), PCI-061T, PCI-062T, PCI-020T, PCI-022T (manufactured by Nippon Kayaku Co., Ltd.), and the like can be given. Of these, UVI-6970, UVI-6974, Adekaoptomer SP-170, SP-171, CD-1012, and MPI-103 are particularly preferable in view of higher photocuring sensitivity of the resulting resin composition.

These cationic photopolymerization initiators can be used either individually or in combinations of two or more as the component (B).

The proportion of the component (B) used in the photocurable resin composition of the present invention is usually, relative to the total weight of the composition, 0.1–10 wt %, preferably 0.2–5 wt %, and more preferably 0.3–3 wt %. If the proportion of the component (B) is too small, decreased photocurablility of the resin composition may result in insufficient mechanical strength of the resulting three-dimensional objects. On the other hand, if the proportion is too large, controlling of cure depth of the resin composition may be difficult due to insufficient phototransmission in the photofabrication, whereby the resulting three-dimensional objects may exhibit insufficient accuracy of fabrication.

Ethylenically Unsaturated Monomer (C)

The ethylenically unsaturated monomer (C) of the photocurable resin composition of the present invention (herein also called "component (C)") is a compound having an ethylenically unsaturated bond (C=C) in the molecule. Examples of such a compound include monofunctional monomers having one ethylenically unsaturated bond in one molecule and polyfunctional monomers having two or more ethylenically unsaturated bonds in one molecule.

The molecular weight of the ethylenically unsaturated monomer (c) is between 80–10,000, preferably between 100–5,000, more preferably between 110–2,000.

As examples of monofunctional monomers which can be suitably used as the component (C), acrylamide, (meth)acryloylmorpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethylene glycol (meth)acrylate, t-octyl (meth)acrylamide, diacetone (meth)acrylamide, dimethylaminoethyl (meth)acrylate, diethylaminoethyl (meth)acrylate, lauryl (meth)acrylate, dicyclopentadiene (meth)acrylate, dicyclopentenyloxyethyl (meth)acrylate, dicyclopentenyl (meth)acrylate, N,N-dimethyl(meth)acrylamidetetrachlorophenyl (meth)acrylate, 2-tetrachlorophenoxyethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidone, phenoxyethyl (meth)acrylate, butoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate, methyltriethylene diglycol (meth)acrylate, alkoxylated phenol (meth)acrylate, alkoxylated alkyl phenol(meth)acrylate, esterified methyltetrahydrofuran (meth)acrylate, esterified 2-isobutoxyl-1,3-dioxane(meth)acrylate, and esterified methylated-2-isobutoxyl-1,3-dioxane(meth)acrylate.

Of these monofunctional monomers, isobornyl (meth)acrylate, lauryl (meth)acrylate, and phenoxyethyl (meth)acrylate are particularly preferable.

As examples of commercially available products of these monofunctional monomers, ARONIX M-101, M-102, M-111, M-113, M-117, M-152, TO-1210 (manufactured by Toagosei Co., Ltd.), KAYARAD TC-110S, R-564, R-128H (manufactured by Nippon Kayaku Co., Ltd.), Viscoat 192, 220, 2311HP, 2000, 2100, 2150, 8F, 17F (manufactured by Osaka Organic Chemical Industry Co., Ltd.), and the like can be given.

Polyfunctional monomers may include those derived from polyalcohols having 3–8 hydroxy groups. Preferably, the polyfunctional monomers are derived from polyalcohols such as pentaerythritols (including di-pentaerythritol) and trialkylolalkaans. The polyalcohols may be reacted with a lactone, for example, caprolactone and the like; and/or alkoxylated with 1–12 moles of an alkoxide including, for example, etheneoxide or propeneoxide. Examples of polyfunctional monomers which can be suitably used as the component (C) include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl) isocyanurate di(meth)acrylate, tris(2-hydroxyethyl) isocyanurate tri(meth)acrylate, caprolactone-modified tris (2-hydroxyethyl)isocyanurate tri(meth)acrylate, trimethylolpropane tri(meth)acrylate, ethylene oxide (hereinafter called "EO") modified trimethylolpropane tri (meth)acrylate, propylene oxide (hereinafter called "PO") modified trimethylolpropane tri(meth)acrylate, tripropylene glycol di(meth)acrylate, neopentyl glycol di(meth)acrylate, bisphenol A diglycidyl ether with both terminal (meth)acrylates, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa (meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like.

As examples of commercially available products of these polyfunctional monomers, SA1002 (manufactured by Mitsubishi Chemical Corp.), Viscoat 195, 230, 260, 215, 310, 214HP, 295, 300, 360, GPT, 400, 700, 540, 3000, 3700 (manufactured by Osaka Organic Chemical Industry Co., Ltd.), KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-2I, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku Co., Ltd.), ARONIX M-210, M-220, M-233, M-240, M-215, M-305, M-309, M-310, M-315, M-325, M-400, M-6200, M-6400 (manufactured by Toagosei Co., Ltd.), Lite Acrylate BP-4EA, BP-4PA, BP-2EA, BP-2PA, DCP-A (manufactured by Kyoeisha Chemical Co., Ltd.), New Frontier BPE-4, BR-42M, GX-8345 (manufactured by Daiichi Kogyo Seiyaku Co., Ltd.), ASF-400 (manufactured by Nippon Steel Chemical Co., Ltd.), Lipoxy SP-1506, SP-1507, SP-1509, VR-77, SP-4010, SP-4060 (manufactured by Showa Highpolymer Co., Ltd.), NK Ester A-BPE-4 (manufactured by Shin-Nakamura Chemical Co., Ltd.), and the like can be given.

The above monofunctional monomers and polyfunctional monomers can be used either individually or in combinations of two or more, or in combinations of at least one monofunctional monomer and at least one polyfunctional monomer as the component (C). It is preferable that the component (C) contain 60 wt % of polyfunctional monomers having three or more ethylenically unsaturated bonds in a molecule. The proportion of these polyfunctional monomers having three or more ethylenically unsaturated bonds used in the component (C) is more preferably 70 wt % or more, even more preferably 80 wt % or more, and most preferably 100 wt %. If the proportion of these polyfunctional monomers is less than 60 wt %, the resin composition may exhibit decreased photocurability and the resulting three-dimensional objects may exhibit deformation with time.

These polyfunctional monomers having three or more ethylenically unsaturated bonds can be selected from the group consisting of the above-mentioned tri(meth)acrylate compounds, tetra(meth)acrylate compounds, penta(meth)acrylate compounds, and hexa(meth)acrylate compounds. Of these, trimethylolpropane tri(meth)acrylate, EO-modified trimethylolpropane tri(meth)acrylate, dipentaerythritol hexa(meth)acrylate, dipentaerythritol penta(meth)acrylate, ditrimethylolpropane and tetra(meth)acrylate are particularly preferable.

The proportion of the component (C) used in the photocurable resin composition of the present invention is usually, relative to the total composition, 5–45 wt %, preferably 7–35 wt %, and more preferably 7–25 wt %. If the proportion of the component (C) is too small, insufficient photocurability of the resin composition may result in inferior mechanical strength of the three-dimensional objects. On the other hand, if the proportion is too large, the resin composition may exhibit shrinkage during curing by irradiation and the resulting three-dimensional objects may exhibit insufficient heat resistance and decreased moisture resistance.

Radical Photopolymerization Initiator (D)

The radical photopolymerization initiator (D) of the photocurable resin composition of the present invention (herein also called "component (D)") is a compound which decomposes by exposure to energy rays such as radiation to initiate radical polymerization of the component (C) with radicals.

As specific examples of the radical photopolymerization initiator used as the component (D), acetophenone, acetophenone benzyl ketal, anthraquinone, 1-(4-isopropylphenyl)-2-hydroxy-2-methylpropan-1-one, carbazole, xanthone, 4-chlorobenzophenone, 4,4'-diaminobenzophenone, 1,1-dimethoxydeoxybenzoin, 3,3'-dimethyl-4-methoxybenzophenone, thioxanethone compounds, 2-methyl-1-[4-(methylthio)phenyl]-2-morpholino-propan-2-on, 2-benzyl-2-dimethylamino-1-(4-morpholinophenyl)-butan-1-one, triphenylamine, 2,4,6-trimethylbenzoyldiphenylphosphine oxide, bis(2,6-dimethoxybenzoyl-2,4,4-trimethylpentylphosphine oxide, benzyl dimethyl ketal, 1-hydroxycyclohexylphenyl ketone, 2-hydroxy-2-methyl-1-phenylpropan-1-one, fluorenone, fluorene, benzaldehyde, benzoin ethyl ether, benzoin propyl ether, benzophenone, Michler's ketone, 3-methyl-acetophenone, 3,3',4,4'-tetra(t-butylperoxycarbonyl)benzophenone (BTTB), combinations of BTTB and dye-sensitizers such as xanthene, thioxanthene, cumarin, and ketocumarin, and the like can be given. Of these, benzyl dimethyl ketal, 1-hydroxycyclohexylphenyl ketone, 2,4,6-trimethylbenzoyldiphenylphosphine oxide, 2-benzyl-2-dimethylamino-1-(4-morpholinophenyl)-butan-1-one, and the like are particularly preferable.

These radical photopolymerization initiators can be used either individually or in combinations of two or more as the component (D).

The proportion of the component (D) used in the photocurable resin composition of the present invention is usually, relative to the total composition, 0.01–10 wt %, and preferably 0.1–8 wt %. If the proportion is too small, the radical polymerization rate (cure rate) of the resin composition may be lower, whereby fabrication may require a longer processing time or resolution may be decreased. On the other hand, if the proportion is too large, curing properties of the resin composition may be impaired or moisture resistance and heat resistance of the resulting three-dimensional objects may be adversely affected by excess polymerization initiator.

Polyol (E)

The polyol having three or more hydroxyl groups is a component for developing the photo-curability of the resin composition (herein also called "component (E)"). The polyol provides assistance to the three-dimensional object to prevent deformation over time (i.e., shape stability) and resistance to change in mechanical characteristics over time (i.e., physical property stability). (over time). Preferably, the polyol used as component (E) has three or more, preferably 3–6 hydroxyl groups. If polyols having less than three hydroxyl groups (i.e., diol) are used, photo-curing characteristics can not be attained and the resulting three-dimensional object lacks the desired mechanical strength. On the other hand, if polyols having more than six hydroxyl groups are used, the elongation and toughness of the resulting three-dimensional object tends to be lower.

Preferred examples of compounds useful as component (E) include polyether polyols having three or more, and preferably from 3 to 6 hydroxyl groups in a molecule. Use of polyether polyols having less than three hydroxyl groups in a molecule (polyether diol) may result in insufficient photocurability of the resin composition and decreased mechanical properties, in particular, low modulus of elasticity of the resulting three-dimensional objects. On the other hand, if polyether polyols having more than six hydroxyl groups in a molecule are used, the resulting three-dimensional objects may exhibit insufficient elongation and decreased moisture resistance.

As examples of the component (E), polyether polyols obtained by modifying polyhydric alcohols having more than three hydroxyl groups such as trimethylolpropane, glycerol, pentaerythritol, sorbitol, sucrose, and quadrol with cyclic ether compounds such as ethylene oxide (EO), propylene oxide (PO), butylene oxide, and tetrahydrofuran can be given. Specific examples include EO-modified trimethylolpropane, PO-modified trimethylolpropane, tetrahydrofuran-modified trimethylolpropane, EO-modified glycerol, PO-modified glycerol, tetrahydrofuran-modified glycerol, EO-modified pentaerythritol, PO-modified pentaerythritol, tetrahydrofuran-modified pentaerythritol, EO-modified sorbitol, PO-modified sorbitol, EO-modified sucrose, PO-modified sucrose, EO-modified sucrose, EO-modified quadrol and the like. Of these, EO-modified trimethylolpropane, PO-modified trimethylolpropane, PO-modified glycerol, PO-modified sorbitol are preferable as the component (E).

The molecular weight of the polyether polyol (E) is preferably 100–2,000, and more preferably 160–1,000. If the molecular weight of the polyether polyol (E) is too small, form stability and physical stability of three-dimensional objects formed from the resin composition may be insufficient. On the other hand, if the molecular weight of the polyether polyol (E) is too large, increased viscosity of the resin composition may give rise to lower modulus of elasticity of the three-dimensional objects formed by photofabrication.

As examples of commercially available products of polyether polyols used as the component (E), Sunnix TP-400, GP-600, GP-1000, SP-750, GP-250, GP-400, GP-600 (manufactured by Sanyo Chemical Industries, Ltd.), TMP-3 Glycol, PNT-4 Glycol, EDA-P-4, EDA-P-8 (manufactured by Nippon Nyukazai Co., Ltd.), G-300, G-400, G-700, T-400, EDP-450, SP-600, SC-800 (manufactured by Asahi Denka Kogyo Co., Ltd.), and the like can be given.

These polyether polyols can be used either individually or in combinations of two or more as the component (E).

The proportion of the component (E) used in the photocurable resin composition of the present invention is usually, relative to the total composition, 5–35 wt %, preferably 7–30 wt %, and more preferably 10–25 wt %. If the proportion is too small, insufficient photocurability of the resin composition may result in decreased form stability and decreased physical stability of the resulting three-dimensional objects. On the other hand, if the proportion is too large, insufficient photocurability of the resin composition may give rise to lower modulus of elasticity for the resulting three-dimensional objects.

(Optionally) Elastomer Particles (F) Having an Average Particle Diameter of 10–700 nm The photocurable resin compositions of the present invention may optionally employ elastomer particles (herein referred to as "component (F)" or "particles (F)"). The elastomer particles (F) having an average particle diameter of 10–700 nm used for the photocurable resin composition of the present invention include elastomer particles such as polybutadiene, polyisoprene, butadiene/acrylonitrile copolymer, styrene/butadiene copolymer, styrene/isoprene copolymer, ethylene/propylene copolymer, ethylene/α-olefin copolymer, ethylene/α-olefin/polyene copolymer, acrylic rubber, butadiene/(meth)acrylate copolymer, styrene/butadiene block copolymer, and styrene/isoprene block copolymer, and core-shell particles obtained by coating these elastomer particles with methyl methacrylate polymer, methyl methacrylate/glycidyl methacrylate copolymer, and the like. Crosslinking structures may be introduced into these elastomer particles by using a commonly used method. As examples of crosslinking agents used in such a method, divinylbenzene, ethylene glycol di(meth)acrylate, diallylmaleate, triallylcyanurate, triallylisocyanurate, diallylphthalate, trimethylolpropane triacrylate, allyl methacrylate, and the like can be given.

Suitable elastomer particles suitably useful as component (F) include, for example, elastomer particles containing polybutadiene, polyisoprene, styrene/butadiene copolymer, styrene/isoprene copolymer, ethylene/propylene copolymer, ethylene/α-olefin copolymer, ethylene/α-olefin/polyene copolymer, acrylic rubber, butadiene/(meth)acrylate copolymer, styrene/butadiene block copolymer, and styrene/isoprene block copolymer as a base component.

Suitable elastomer particles of the the core-shell type include, for example, elastomer particles in which a partially crosslinked core of polybutadiene, polyisoprene, styrene/butadiene copolymer, styrene/isoprene copolymer, ethylene/propylene copolymer, ethylene/α-olefin copolymer, ethylene/α-olefin/polyene copolymer, acrylic rubber, butadiene/(meth)acrylate copolymer, styrene/butadiene block copolymer, styrene/isoprene block copolymer, and the like is coated with methyl methacrylate polymer, methyl methacrylate/glycidyl methacrylate copolymer, and the like. A ratio of a core radius to a shell thickness of the core-shell composite particles is usually from 1/2 to 1000/1, preferably from 1/1 to 200/1 (for example, if the core radius is 350 nm and the shell thickness is 10 nm, the ratio is expressed as 35/1).

Of these elastomer particles, elastomer particles in which a partially crosslinked core of polybutadiene, polyisoprene, styrene/butadiene copolymer, styrene/isoprene copolymer, butadiene/(meth)acrylate copolymer, styrene/butadiene block copolymer, and styrene/isoprene block copolymer is coated with methyl methacrylate polymer, methyl methacrylate/glycidyl methacrylate copolymer are particularly preferable.

These elastomer particles can be prepared by using a commonly used method such as an emulsion polymerization. The emulsion polymerization can be carried by several different methods, for example, (i) polymerizing all the monomer component in one reaction; (ii) polymerizing part of a monomer component first, then continuously or intermittently adding the remaining part of the monomer component to polymerize; (iii) polymerizing a monomer component while continuously adding the monomer component during polymerization; or (iv) polymerizing a monomer component by using seed particles.

An average particle diameter of the elastomer particles thus obtained is 10–700 nm. If the elastomer particles having an average particle diameter of less than 10 nm are used, not only the resulting three-dimensional objects may exhibit decreased impact resistance but also productivity and accuracy of fabrication of these objects may be adversely affected by increased viscosity of the resin composition. On the other hand, if the elastomer particles having an average particle diameter of more than 700 nm are used, the surface of the resulting three-dimensional object may be rough or inaccurate fabrication may result.

As examples of commercially available products of these core-shell elastomer particles, Reginous Bond RKB (manufactured by Reginous Chemical Industries Co., Ltd.), Techno MBS-61, MBS-69 (manufactured by Techno Polymer Co., Ltd.), and the like can be given.

These elastomer particles can be used either individually or in combinations of two or more as the component (F).

When elastomer particles are employed the proportion of the component (F) used in the photocurable resin composition of the present invention is usually, relative to the total weight of the composition, 1–35 wt %, more preferably 3–30 wt %, and even more preferably 5–20 wt %. If the proportion is too small, the resulting three-dimensional objects may exhibit decreased impact resistance. On the other hand, if the proportion is too large, the resulting objects may exhibit low accuracy of fabrication.

(Optionally) Epoxy-Branched Alicyclic Compound (G)

The photocurable resin compositions of the present invention may optionally employ a further type of cationically polymerizable compound (herein referred to as "component (G)"). The cationically polymerizable compound (G) used in the photocurable resin composition of the present invention includes alicyclic compounds wherein at least one epoxy containing group is bound to the alicyclic group through a single carbon—carbon bond(herein referred to as "an epoxy-branched alicyclic compound"). Preferably, the attaching carbon from the epoxy containing group is one of the carbons bound to the oxygen atom forming the epoxy group.

More preferably, the attached epoxy containing group includes a 1,2-epoxy wherein the oxygen bridges the terminal carbon and the immediately adjacent carbon attached thereto, one of which I attached to a carbon from the alicyclic ring. Most preferably, the epoxy group is an epoxyethyl group.

The alicyclic group of the alicyclic compound is further preferably bound, via an oxygen atom link, to a residual group of an organic compound having a valency of from 1–100, preferably from 2–50, and more preferably from 2–30. Typically, the average valency is between 1.6 and 100, preferably, between 1.8 and 50. Preferably, the alicyclic compound will comprise at least 1 epoxy-branched alicyclic group and more preferably at least 2 epoxy-branched alicyclic groups bound via a bivalent oxygen to the organic compound residue.

The precursor compound for the organic residue include, for example, alcohols, phenols, carboxylic acids, amines, thiols, and the like can be given. As examples of the alcohols, monohydric and polyhydric alcohols, for example, aliphatic alcohols such as methanol, ethanol, propanol, butanol, pentanol, hexanol, and octanol, aromatic alcohols such as benzyl alcohol, and polyhydric alcohols such as ethylene glycol, diethylene glycol, triethylene glycol, polyethylene glycol, propylene glycol, dipropylene glycol, 1,3-butanediol, 1,4-butanediol, pentane diol, 1,6-hexanediol, neopentyl glycol, neopentyl glycol oxypivalate, cyclohexanedimethanol, glycerol, diglycerol, polyglycerol, trimethylolpropane, trimethylolethane, pentaerythritol, and dipentaerythritol can be given.

As examples of the phenols, phenol, cresol, catechol, pyrogallol, hydroquinone, hydroquinone monomethyl ether, bisphenol A, bisphenol F, 4,4'-dihydroxybenzophenone, bisphenol S, phenol resin, and cresol novolak resin can be given.

As examples of the carboxylic acids, formic acid, acetic acid, propionic acid, butyric acid, fatty acid of animals and plants, fumaric acid, maleic acid, adipic acid, dodecanoic diacid, trimellitic acid, pyromellitic acid, polyacrytic acid, phthalic acid, isophthalic acid, and terephthalic acid can be given. A compound having both hydroxyl group and carboxylic acid such as lactic acid, citric acid, and oxycaproic acid can also be given as examples.

Examples of the amines include methylamine, ethylamine, propylamine, butylamine, pentylamine, hexylamine, cyclohexylamine, octylamine, dodecylamine, 4,4'-diaminodiphenylmethane, isophoronediamine, xylenediamine, diethylenetriamine, triethylenetetramine, ethanolamine, and the like.

Examples of the thiols include mercaptans such as methylmercaptan, ethylmercaptan, propylmercaptan, and phenylmercaptan, mercaptopropionic acid or polyhydric alcohol esters of mercaptopropionic acid, for example, ethylene glycol dimercaptopropionate, trimethylolpropane trimercaptopropionate, and pentaerythritol pentamercaptopropionate, and the like.

As examples of the other precursor compounds, polyvinyl alcohol, partial hydrolysis product of polyvinyl acetate, starch, cellulose, cellulose acetate, cellulose acetate butyrate, hydroxyethyl cellulose, acrylic polyol resin, styrene-allyl alcohol copolymer resin, styrene-maleic acid copolymer resin, alkyd resin, polyester polyol resin, polyester carboxylic acid resin, polycaprolactone polyol resin, polypropylene polyol, polytetramethylene glycol, and the like can be given.

The precursor organic compounds may contain an unsaturated double bond in the skeleton. Specific examples of such compounds include allyl alcohol, acrylic acid, methacrylic acid, and the like.

Preferably, the residual organic group will be linked via an oxy group to at least one, preferably at least two, epoxyalkyl-branched cycloalkyl (or epoxyalkylcycloalkyl) groups. More preferably, the epoxyalkylcycloalkyl group will include those wherein the cycloalkyl group is additionally oxy substituted, preferably hydroxy substituted, which may be referred to as an oxy-substituted (epoxyalkyl-branched) cycloalkyl. Preferably, the alkyl groups include lower alkyls comprising eight or less carbon atoms. Preferably, the epoxyalkyl will comprise 2 carbon atoms and the cycloalkyl will comprise from 5 to 6 carbon atoms. Preferred epoxyalkyl-branched cycloalkyl groups include hydroxyepoxyethylcyclohexyl groups, for example, a 1-hydroxy-3-(1,2-epoxyethyl)cyclohexyl group wherein epoxy-branched alicyclic compounds having a [(1,2-epoxyethyl)cyclohexylene]oxy group at a terminal being particularly preferred.

The molecular weight of the epoxy-branched alicyclic compound (G) is between 120 and 10,000, preferably between 150 and 5,000, more preferably between 180 and 2,000.

Suitable epoxy-branched alicyclic compounds (G) include, for example, those derived from trimethylolpropane, etherified with (a+b+c)1-hydroxy-3-(1,2-epoxyethyl)cyclohexyl groups, wherein a, b and c are integers from 0–15 individually, provided that a+b+c=15, and compounds derived from dipentaerythritol etherified with (a+b+c+d+e+f) epoxy-branched 1-hydroxy-cyclohexyl groups can be given, wherein the epoxy group includes 1,2-epoxyethyl and a, b, c, d, e, and f are integers from 0–18, provided that a+b+c+d+e+f=18, and compounds derived from pentaerythritol etherified with (a+b+c+d) epoxy-branched 1-hydroxycyclohexyl groups can be given wherein a, b, c and d are integers from 0–16 individually, provided that a+b+c+d=16, and compounds derived from ethylene glycol etherified with (a+b) epoxy-branched 1-hydroxycyclohexyl groups can be given, wherein a and b are integers from 0–20 individually, provided that a+b=20.

Commercially available products of epoxy-branched alicyclic compounds (G) EHPE3150 (manufactured by Daicel Chemical Industries, Ltd.), as described in U.S. Pat. No. 5,827,575, the entire disclosure of which is hereby incorporated by reference.

Component (G), when employed in the photofabrication composition of the present invention, may include a single type of the epoxy-branched alicyclic compound or combinations of two or more.

The proportion of the epoxy-branched alicyclic compound (G) used in the photocurable resin composition of the present invention is usually, relative to the total weight of the composition, 2–45 wt %, preferably 5–40 wt %, and particularly preferably 10–35 wt %. If the proportion is too small, heat resistance and fabrication of the resulting three-dimensional objects are insufficient. On the other hand, if the proportion is too large, increased viscosity of the resin composition gives rise to inferior fabrication of the resulting objects.

Additional Optional component

The photocurable resin composition of the present invention may additional contain optional components such as photosensitizers (polymerization accelerator) and reactive diluents other than the above indispensable components (A)–(G) insofar as the effect of the present invention is not impaired.

As examples of photosensitizers, amine compounds such as triethanolamine, methyldiethanolamine, triethylamine, and diethylamine, thioxanethone, derivatives of thioxanethone, anthraquinone, derivatives of anthraquinone, anthracene, derivatives of anthracene, perylene, derivatives of perylene, benzophenone, benzoin isopropyl ether, and the like can be given. As examples of reactive diluents, vinyl ethers, vinyl sulfides, vinylurethanes, urethane acrylates, vinylureas, and the like can be given.

Various additives may be added to the photocurable resin composition for photofabrication of the present invention as other optional components inasmuch as the object and the effect of the present invention are not adversely effected. Examples of such additives include polymers or oligomers such as epoxy resin, polyamide, polyamideimide, polyurethane, polybutadiene, polychloroprene, polyether, polyester, styrene-butadiene block copolymer, petroleum resin, xylene resin, ketone resin, cellulose resin, fluorine-containing oligomer, silicone-containing oligomer, and polysulfide oligomer, polymerization inhibitors such as phenothiazine and 2,6-di-t-butyl-4-methylphenol, polymerization initiation adjuvant, leveling agents, wettability improvers, surfactants, plasticizers, UV absorbers, silane coupling agents, inorganic fillers, pigments, dyes, and the like.

The photocurable resin composition of the present invention can be prepared by mixing the above components (A)–(E)and optionally (F) and/or (G) homogeneously together with any additional optional components, as required.

Viscosity of the photocurable resin composition at 25° C. is preferably 50–2,000 cps, and more preferably 70–1,500 cps.

A cured photofabrication composition of the present invention preferably has high impact strength. Preferably, the cured composition of the present invention will have an impact strength of at least 3.5 Kg-cm/cm$^2$, in particular an impact strength of at least 4.0 Kg-cm/cm$^2$, and more particularly 4.5 Kg-cm/cm$^-$, as measured in accordance with the Izod Impact Strength test set forth in the Examples.

Photofabrication of Three-dimensional Objects

The above-described photocurable liquid resin composition of the present invention can be suitably used as a photocurable liquid resin material used in the photofabrication of three-dimensional objects. The three-dimensional objects can be fabricated from the photocurable resin composition of the present invention by the photofabrication process, wherein energy required for curing is provided for the composition by selective exposure to radiation such as visible rays, ultraviolet rays, and infrared rays.

There are no specific limitations to the means of selectively irradiating the photocurable resin composition. Examples of such means include: irradiating the composition by scanning with laser beams or focused rays converged by lenses or mirrors; irradiating the composition with unfocused rays via a mask having a phototransmission portion with a specified pattern; and irradiating the composition by using a photoconductive material consisting of bundled multiple optical fibers, wherein the composition is irradiated via specific optical fibers corresponding to the specified pattern of the photo-conductive material. In the above means utilizing a mask, a mask which electrooptically forms a mask image consisting of a photo-transmission area and a non-phototransmission area according to a specified pattern by the same theory as that of liquid crystal display can be used. If microfabrication or higher dimensional accuracy is required for objective three-dimensional objects, it is preferable to employ the means comprising scanning with laser beams having a small spot diameter as the means of selectively irradiating the composition.

The irradiated surface of the resin composition in a vessel (for example, scanning plane of focused rays) may be the liquid surface of the resin composition or the surface of the boundary of the resin composition with the wall of the vessel. In this case, the composition can be exposed to radiation either directly or indirectly via the wall of the vessel.

In the above-described photofabrication of three-dimensional objects, after a specified area of the resin composition has been cured, an objective three-dimensional shape is usually fabricated by laminating the cured areas by continuously or gradually moving the irradiation spot (irradiation surface) from the cured area to the uncured area. Here, the irradiation spot can be moved by, for example, moving any one of a light source, the vessel of the resin composition, and the cured area of the resin composition, or additionally providing the resin composition in the vessel.

A typical example of the above photofabrication of three-dimensional objects will be described below. First, in a vessel equipped with a support stage arranged to optionally rise and fall, a thin layer (1) of the resin composition is formed over the support stage by slightly lowering (submerging) the support stage below the liquid surface of the resin composition. This thin layer (1) is selectively irradiated to form a cured solid resin layer (1). The photocurable resin composition is provided over this cured resin layer (1) to form a thin layer (2). This thin layer (2) is then selectively irradiated to form a new cured resin layer (2) integrally laminated over the cured resin layer (1). By repeating this process certain times using the same or different irradiated patterns, the three-dimensional object consisting of an integrally-laminated plural cured resin layer (n) can be formed.

The resulting three-dimensional object is then removed from the vessel. After the residual unreacted resin compositions remaining on the surface are removed, the object is optionally washed. As washing agents, alcohol organic solvents such as isopropyl alcohol and ethyl alcohol, ketone organic solvents such as acetone, ethyl acetate, and methyl ethyl ketone, aliphatic organic solvents represented by terpenes, and a low-viscosity heat-curable or photo-curable resin can be given.

If three-dimensional objects having a smooth surface are required, it is preferable to wash the objects using the above heat-curable or photo-curable resin. In this case, in accordance with the types of curable resins used for washing the object, postcuring by using heat- or photo-irradiation may be required. In addition, since not only the resins on the surface of the object but also the unreacted resin compositions remaining inside the three-dimensional objects can be cured by the postcure, it is also preferable to carry out the postcure after the objects are washed with the organic solvents.

The three-dimensional objects thus obtained exhibit excellent mechanical strength, high dimensional accuracy, and superior heat resistance. Moreover, said three-dimensional objects excel in form stability and physical stability, whereby the objects exhibit superior impact resistance and higher folding endurance when used as prototypes for mechanical parts.

Furthermore, in order to improve surface hardness and heat resistance of the three-dimensional objects, it is preferable to coat the surface of the objects with heatcurable or photocurable hard coating materials after washing the object. As these hard coating materials, organic coating materials such as acrylic resin, epoxy resin, and silicone resin or inorganic hard coating materials can be used. These hard coating materials can be used either individually or in combinations of two or more.

Utility

As described above, the composition of the present invention can be suitably used for photofabrication of three-dimensional objects. Moreover, owing to excellent mechanical strength of the resulting cured product, the composition of the present invention is useful as a coating material for plastics, various films, wood, ceramic wares, glass, communications quartz fibers, papers, metals, cans for drink, fibers, and the like, a resin for photofabrication of three-dimensional objects, sealing agents or adhesives for semiconductor devices, underfilling agents, adhesives for optical materials, printing board materials, and the like.

EXAMPLES

The present invention will now be described in detail by way of examples, which should not be construed as limiting the present invention.

Example 1

According to the formulations of Table 1, a vessel equipped with a stirrer was charged with 30 parts by weight of 3,4-epoxycyclohexylmethyl-3',4'-epoxycyclohexane-carboxylate "UVR-6110" (manufactured by Union Carbide Corp.), 5 parts by weight of bis(3,4-epoxycyclohexyl-methyl)adipate "UVR-6199" (manufactured by Union Carbide Corp.), 3 parts by weight of 1,6-hexanediol diglycidyl ether "Epolite 1600" (manufactured by Kyoeisha Chemical Co., Ltd.), 2 parts by weight of triarylsulfoniumhexafluoro-antimonate "UVI-6974" (manufactured by Union Carbide Corp.), 25 parts by weight of trimethylolpropane triacrylate "Viscoat 295" (manufactured by Osaka Organic Chemical Industry Co., Ltd.), 4 parts by weight of 1-hydroxycyclo-hexylphenyl ketone "Irgacure 184" (manufactured by Ciba Specialty Chemicals Co., Ltd.), 15 parts by weight of PO-modified glycerol "Sunnix GP-400" (manufactured by Sanyo Chemical Industries, Ltd.), and 16 parts by weight of core-shell elastomer particles (core: partially crosslinked styrene/butadiene copolymer, shell: methyl methacrylate/glycidyl methacrylate) having an average particle diameter of 50 nm "Reginas Bond RKB" (manufactured by Reginous Chemical Industries Co., Ltd.). The mixture was stirred for three hours at 60° C. to obtain a liquid composition (the resin composition of the present invention). Viscosity of the resulting liquid composition at 25° C. measured by using a Brookfield type viscometer was 820 cps.

Examples 2–7

Liquid compositions (the photocurable resin compositions of the present invention) were obtained in the same manner as in Example 1 except for changing the formulations of components (A)–(F) as shown in Table 1. Viscosity of each resulting liquid composition at 25° C. measured by using a Brookfield type viscometer is shown in Table 1.

Comparative Examples 1–2

Liquid compositions (photocurable resin compositions for comparison) were obtained in the same manner as in Example 1 except for changing the formulations of each component as shown in Table 1. Viscosity of each resulting liquid composition at 25° C. measured by using a Brookfield type viscometer is shown in Table 1.

TABLE 1

|  | Examples | | | | | | | Comparative Examples | |
| --- | --- | --- | --- | --- | --- | --- | --- | --- | --- |
|  | 1 | 2 | 3 | 4 | 5 | 6 | 7 | 1 | 2 |
| 3,4-Epoxycyclohexylmethyl-3',4'-epoxycyclohexane carboxylate (component (A))[1] | 30 | 30 | 30 | 25 | 27 | 25 | 27 | — | 43 |
| Bis(3,4-epoxycyclohexylmethyl)adipate (component (A))[2] | 5 | 10 | 25 | 30 | 35 | 30 | 25 | — | 25 |
| 1,6-Hexanediol diglycidyl ether (component (A))[3] | 3 | 5 | 10 | 15 | 15 | — | — | — | 10 |
| Neopentylglycol diglycidyl ether (component (A))[4] | — | — | — | — | — | 15 | 10 | — | — |
| Triarylsulfoniumhexafluoro antimonate (component (B))[5] | 2 | 2 | 2 | 2 | 2 | 2 | 2 | 2 | 2 |
| Trimethylolpropane triacrylate (component (C))[6] | 25 | 22 | 13 | 11 | 7 | 11 | 13 | 35 | — |
| 1-Hydroxycyclohexyl phenyl ketone (component (D))[7] | 4 | 4 | 2 | 2 | 2 | 2 | 2 | 4 | 2 |
| PO-modified glycerol (component E))[8] | 15 | 12 | 10 | 9 | 7 | 9 | 13 | 34 | 10 |
| Particles having an average particle diameter of 50 nm (core: partially crosslinked styrene/butadiene copolymer, shell: methyl methacrylate/glycidyl methacrylate) (component (F))[9] | — | — | — | — | — | 6 | — | — | — |
| Particles having an average particle diameter of 200 nm (core: partially crosslinked styrene/butadiene copolymer, shell: methyl methacrylate/glycidyl methacrylate) (component (F))[10] | 16 | 15 | 8 | 6 | 5 | — | — | 25 | 8 |
| Particles having an average particle diameter of 200 nm (core: partially crosslinked styrene/isoprene copolymer, shell: methyl methacrylate/glycidyl methacrylate) (component (F))[10] | — | — | — | — | — | — | 8 | — | — |
| Viscosity (cps/° C.) | 820 | 780 | 640 | 500 | 520 | 510 | 590 | 5500 | 720 |

Notes
[1] UVR-6110 (manufactured by Union Carbide Corp.)
[2] UVI-6199 (manufactured by Union Carbide Corp.)
[3] Epolite 1600 (manufactured by Kyoeisha Chemical Co., Ltd.)
[4] Epolite 1500NP (manufactured by Kyoeisha Chemical Co., Ltd.)
[5] UVI-6974 (manufactured by Union Carbide Corp.)
[6] Viscoat 295 (manufactured by Osaka Organic Chemical Industry Co., Ltd.)
[7] Irgacure 184 (manufactured by Ciba Specialty Chemicals Co., Ltd.)
[8] Sunnix GP-400 (manufactured by Sanyo Chemical Industries, Ltd.)
[9] Reginous Bond RKB (manufactured by Reginous Chemical Industries Co., Ltd.)
[10] particles prepared by emulsion polymerization As shown in Table 1, the viscosity of the resin compositions of Examples 1–7 were found to be suitable for the photofabrication of three-dimensional objects.

Evaluation of Photocurable Resin Composition

Each photocurable resin composition obtained in Examples 1–7 and Comparative Examples 1–2 was cured by using an Ar laser. Curability of these compositions were evaluated according to the method described below. The results are shown in Table 2. A modulus of elasticity, its variation with time, and deformation with time of the resulting cured products were measured by using a method described below. The results were shown in Table 2. Moreover, Izod impact strength and folding endurance of the cured products were measured by using a method described below. The results are shown in Table 2.

Evaluation of Curability by Ar Laser

A minimum energy value at which the resin compositions cured was measured by selectively irradiating the photocurable resin compositions with a laser beam. In this measurement, a photofabrication apparatus "Solid Creator JSC-2000" (manufactured by SONY CORP.) equipped with an Ar ion laser (wavelength: 351 nm, 365 nm) as a light source was used under the following conditions: laser spot diameter at the irradiated surface (liquid surface): 200 μm; laser power: 100 mW; scanning speed: from 100 mm/second to 1,000 mm/second. A resin exhibiting a smaller minimum energy value was determined as a resin having higher curability. According to the minimum energy values, curability of the resin compositions obtained in Examples and Comparative Examples was rated as excellent, good, or bad.

Measurement of Modulus of Elasticity, Transparency and Its Variation With Time (1) Preparation of test specimen The compositions were applied on a glass plate using an applicator to form a coating film with a thickness of 200 μm. The surface of the coating film was irradiated with ultraviolet rays at a dose of 0.5 J/cm² using a conveyer curing apparatus equipped with a metal halide lamp to prepare a semi-cured resin film. The semi-cured resin film peeled from a glass plate was put on a releasable paper. The semi-cured resin film was then irradiated with ultraviolet rays at a dose of 0.5 J/cm² to the surface opposite to the first irradiated surface to form a cured resin film.

The cured resin film thus obtained was allowed to stand under the following conditions to prepare test specimens 1 and 2.

Test specimen 1: Conditioned at a constant temperature of 23° C. and a relative humidity of 50% for 24 hours.

Test specimen 2: Conditioned at a constant temperature of 23° C. and a relative humidity of 50% for 30 days.

(2) Measurement

Transparency

Transparency of the test specimen 1 was evaluated with the naked eye.

Modulus of Elasticity A modulus of elasticity (drawing speed: 1 mm/min, bench mark distance: 25 mm) of each test specimen 1 (for measurement of initial value) and 2 (for measurement of variation with time) was measured at a constant temperature of 23° C. and a relative humidity of 50%.

Deformation With Time (1) Preparation of test specimen

A cured resin layer (thickness: 0.20 mm) was formed by selectively irradiating the photocurable resin compositions with a laser beam using Solid Creator JSC-2000. The surface(liquid surface) was irradiated using a laser beam with a power of 100 mW at a scanning speed so that cure depth of each composition was 0.3 mm. By repeating this step, a measurement model (hereinafter called "warping model") as shown in FIG. 1 was formed. This warping model was then removed from the photofabrication apparatus. The resin composition adhering to the surface of the warping model was wiped off and excess resin composition was removed from the model by washing with a terpene solvent.

(2) Measurement

Figure 2:
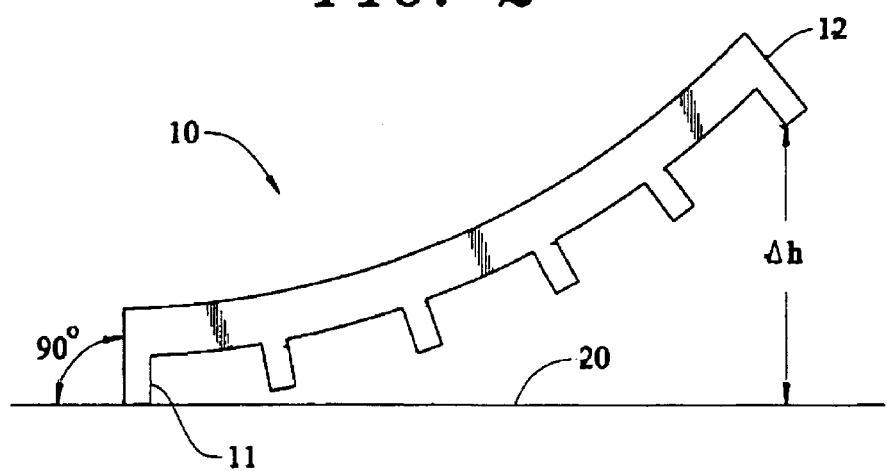
FIG. 2 is an elevation view of the three-dimensional model, of FIG. 1, in the for measuring accuracy of fabrication (dimension) of the cured products formed from the photocurable compositions of Examples and Comparative Examples.

As shown in FIG. 2, a leg 11 of the resulting three-dimensional warping model 10 was fixed to a horizontal stand 20 as shown in FIG. 2. A distance (uplifting) between the horizontal stand 20 and the bottom end of a distal leg 12 was determined as warping (initial value). The warping model was then conditioned at a constant temperature of 23° C. and a relative humidity of 50% for 30 days. The warping amount of this warping model was measured in the same manner as described above. The deformation with time of the compositions was determined by comparing the newly measured value with the initial value and rated as excellent, good, or bad in the order of the increasing warping amount.

Measurement of Impact Strength (1) Preparation of test specimen

A cured resin layer (thickness: 0.20 mm) was formed by selectively irradiating the photocurable resin composition with a laser beam using Solid Creator JSC-2000. The surface(liquid surface) was irradiated using a laser beam with a power of 100 mW at a scanning speed so that cure depth of each composition was 0.3 mm. By repeating this step, test specimens according to JIS K7110 were formed.

(2) Measurement

The test specimens were conditioned at a constant temperature of 23° C. and a relative humidity of 50% for about 24 hours. Izod impact strength of the test specimens was measured according to JIS K7110.

Test of Folding Endurance (1) Preparation of test specimen

The compositions were applied on a glass plate using an applicator to form a coating film with a thickness of 200 μm. The surface of the coating film was irradiated with ultraviolet rays at a dose of 0.5 J/cm² using a conveyer curing apparatus equipped with a metal halide lamp to prepare a semi-cured resin film. The semi-cured resin film peeled from a glass plate was put on a released paper. The opposite surface of the first irradiated side of the semi-cured resin film was then irradiated with ultraviolet rays at a dose of 0.5 J/cm² to form a cured resin film.

(2) Measurement

The test specimen was conditioned at a constant temperature of 23° C. and relative humidity of 50% for about 24 hours. The test specimen was repeatedly folded at 60 times per second with a constant load of 100 g using an MIT folding endurance tester. Folding endurance of test specimens was evaluated by the number of times of the test specimen was folded before the test specimen breaks. In the case where the number was 30 or more the result was rated as good, in the case where the number was less than 30 the result was rated as bad.

Evaluation of Accuracy of Fabrication

Accuracy of fabrication of three-dimensional objects was evaluated by measuring the dimensions of the three-dimensional objects formed from each liquid resin.

(1) Formation of three-dimensional object

Figure 3:
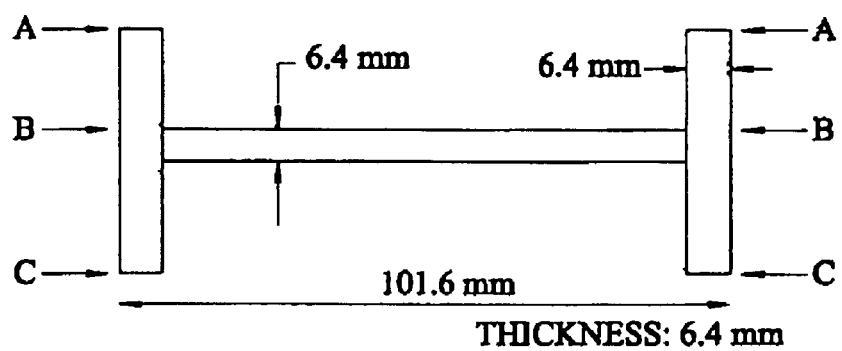
FIG. 3 is an elevation view of a three-dimensional object used for measuring dimensional accuracy of the cured products formed from the photocurable compositions of Examples and Comparative Examples.

H-shaped three-dimensional objects as shown in FIG. 3 were formed by using Solid Creator JCS-2000 according to the following conditions.

TABLE 2

|  | Examples | | | | | | | Comparative Examples | |
| --- | --- | --- | --- | --- | --- | --- | --- | --- | --- |
|  | 1 | 2 | 3 | 4 | 5 | 6 | 7 | 1 | 2 |
| Curability | Excellent | Excellent | Excellent | Excellent | Excellent | Excellent | Excellent | Bad | Bad |
| Modulus of elasticity | | | | | | | | | |
| (after 24 hours) | 158 | 160 | 180 | 175 | 180 | 175 | 180 | — | 190 |
| (after 30 days) | 154 | 156 | 178 | 170 | 175 | 170 | 174 | — | 182 |
| Accuracy of fabrication | ○ | ○ | ⊙ | ⊙ | ⊙ | ⊙ | ⊙ | X | X |
| Warping model | | | | | | | | Test specimen could not be formed | Test specimen could not be formed |
| (immediately after test specimen was formed) | Good | Excellent | Excellent | Excellent | Excellent | Excellent | Excellent | | |
| (after 30 days) | Good | Good | Excellent | Excellent | Excellent | Excellent | Excellent | | |
| Izod impact strength (kg · cm/cm$^2$) | 5.2 | 5.1 | 4.6 | 4.8 | 4.7 | 4.6 | 4.8 | Test specimen could not be formed | Test specimen could not be formed |
| Folding endurance | Good | Good | Good | Good | Good | Good | Good | — | Good |

These three-dimensional objects were conditioned at a constant temperature of 23° C. and under relative humidity of 50% for about 24 hours.

Fabrication Conditions

The three-dimensional objects were formed under the same conditions as in the above-described preparation of the test specimens for evaluation of deformation with time (laser beam intensity at the liquid surface: 100 mW, scanning speed: an optimum scanning speed at which cure depths of each composition were 0.30 mm, thickness of cured resin layer: 0.2 mm).

(2) Measurement of dimensional accuracy of three-dimensional object

Dimensions A, B, and C, which are shown in FIG. 3, of the resulting three-dimensional objects were measured by using a 0.01 mm graduated caliper. The dimensional deviations of A, B, and C were determined according to the following formulas (I) and (II).

Dimensional difference between A and B=(A−B)  (I)

Dimensional difference between C and B=(C−B)  (II)

The results of evaluation were rated as follows.

absolute values of dimensional differences both between A and B and between C and B were less than 0.1 mm: ⊙ one of the absolute values of dimensional differences between A and B and between C and B was less than 0.1 mm and the other was between 0.1 and 0.19 mm: ○ absolute values of dimensional differences both between—A and B and between C and B were between 0.1 and 0.19 mm: Δ one of the absolute values of dimensional differences between A and B and between C and B was 0.2 mm or more or no three-dimensional object was formed: X As shown in Table 2, each cured product formed from the compositions obtained in Examples 1–7 exhibited high accuracy of fabrication, high modulus of elasticity, and excellent stability with time. Superior form stability of the cured products formed from the compositions was evident from small deformation (warping) caused by shrinkage during curing. Moreover, these cured products exhibited excellent impact resistance and high folding endurance.

The cured product formed from the composition of Comparative Example 1 in which the component (F) was not blended exhibited inferior impact resistance and insufficient folding endurance. No three-dimensional object was formed from the composition of Comparative Example 1 in which the component (A) was not blended because of insufficient curability. In spite of sufficient viscosity of the cured product, no three-dimensional object was formed from the composition of Comparative Example 2 in which the component (C) was not blended.

Examples 8–14

According to the formulations of Table 3, transparent liquid compositions (the photocurable resin compositions of the present invention) were obtained in the same manner as in Example 1 except for varying the blend of the components (A)–(F) and adding optional components. Viscosity (25° C.) of each resulting liquid composition measured by using a Brookfield type viscometer is shown in Table 3.

Comparative Examples 3–5

According to the formulations of Table 3, transparent liquid compositions (photocurable resin compositions for comparison) were obtained in the same manner as in Example 1 except for varying the blend of each component. Viscosity (25° C.) of each resulting liquid composition measured by using a Brookfield type viscometer is shown in Table 3.

TABLE 3

|  | Examples | | | | | | | Comparative Examples | | |
| --- | --- | --- | --- | --- | --- | --- | --- | --- | --- | --- |
|  | 8 | 9 | 10 | 11 | 12 | 13 | 14 | 3 | 4 | 5 |
| 3,4-Epoxycyclohexylmethyl-3',4'-epoxycyclohexanecarboxylate (component (A))[1] | — | 13 | 25 | 27 | 34 | 23 | 23 | — | — | 23 |
| Bis(3,4-epoxycyclohexylmethyl)adipate (component (A))[2] | 28 | 25 | 33 | 38 | 38 | 35 | 35 | — | — | 35 |
| Triarylsulfonium hexafluoroantimonate (component (B))[3] | 2 | 2 | 2 | 2 | 2 | 2 | 2 | 2 | 2 | 2 |
| Trimethylolpropane triacrylate (component (C))[4] | 25 | 20 | 13 | 13 | 10 | — | 5 | 51 | 15 | — |
| Pentaerythritol triacrylate (component (C))[5] | — | — | — | — | — | 13 | — | — | — | — |
| Dipentaerythritol hexaacrylate (component (C))[6] | — | — | — | — | — | — | 8 | — | — | — |
| 1-hydroxycyclohexylphenyl ketone (component (D))[7] | 2 | 2 | 2 | 2 | 2 | 2 | 2 | 2 | 2 | 2 |
| PO-modified glycerol (component (E))[8] | 12 | 10 | 10 | 10 | 8 | 10 | 10 | 15 | 10 | 15 |
| Particles having an average particle diameter of 50 nm (core: partially cross-linked styrene/butadiene copolymer, shell: methyl methacrylate/glycidyl methacrylate) (component (F))[9] | 15 | 12 | 7 | 8 | — | — | — | — | 7 | — |
| Particles having an average particle diameter of 200 nm (core: partially crosslinked styrene/butadiene copolymer, shell: methyl methacrylate/glycidyl methacrylate) (component (F))[10] | — | — | — | — | 6 | 7 | 7 | 15 | — | 15 |
| Neopentylglycol diglycidyl ether[11] | 16 | 16 | 8 | — | — | 8 | 8 | 15 | 8 | 8 |
| Hydrogenated bisphenol A diglycidyl ether[12] | — | — | — | — | — | — | — | — | 56 | — |
| Viscosity (cps/° C.) | 750 | 690 | 520 | 640 | 620 | 780 | 890 | 350 | 2200 | 850 |

(Note)
[1] "UVR-6110" (manufactured by Union Carbide Corp.)
[2] "UVI-6199" (manufactured by Union Carbide Corp.)
[3] "UVI-6974" (manufactured by Union Carbide Corp.)
[4] "Viscoat 295" (manufactured by Osaka Organic Chemical Industry Co., Ltd.)
[5] "Viscoat 300" (manufactured by Osaka Organic Chemical Industry Co., Ltd.)
[6] "DPHA" (manufactured by Nippon Kayaku Co., Ltd.)
[7] "Irgacure 184" (manufactured by Ciba Specialty Chemicals Co., Ltd.)
[8] "Sunnix GP-400" (manufactured by Sanyo Chemical Industries, Ltd.)
[9] "Reginous Bond RKB" (manufactured by Reginous Chemical Industries Co., Ltd.)
[10] particles prepared by emulsion polymerization
[11] "Epolite 1500NP" (manufactured by Kyoeisha Chemical Co., Ltd.)
[12] "Epolite 4000" (manufactured by Kyoeisha Chemical Co., Ltd.)

As shown in Table 3, the compositions obtained in Examples 8–14 had a suitable viscosity as the resin composition for photofabrication of three-dimensional objects and were tested, in accordance with the tests set forth above for Examples 1–7, and the results are presented below in Table 4.

TABLE 4

|  | Examples | | | | | | | Comparative Examples | | |
| --- | --- | --- | --- | --- | --- | --- | --- | --- | --- | --- |
|  | 8 | 9 | 10 | 11 | 12 | 13 | 14 | 3 | 4 | 5 |
| Curability | Excellent | Excellent | Excellent | Excellent | Excellent | Excellent | Excellent | Bad | Bad | Bad |
| Transparency of cured film | Transparent | Transparent | Transparent | Transparent | Transparent | Transparent | Transparent | Transparent | Transparent | Transparent |
| Modulus of elasticity |  |  |  |  |  |  |  |  |  |  |
| (after 24 hours) | 142 | 158 | 175 | 183 | 182 | 173 | 179 | — | — | 160 |
| (after 30 days) | 135 | 153 | 171 | 179 | 177 | 165 | 173 | — | — | 152 |
| Accuracy of fabrication | ○ | ○ | ⊙ | ⊙ | ⊙ | ⊙ | ⊙ | X | X | X |
| Warping model |  |  |  |  |  |  |  | Test specimen could not be formed | Test specimen could not be formed | Test specimen Could not be formed |
| (immediately after test specimen was formed) | Good | Excellent | Excellent | Excellent | Excellent | Excellent | Excellent | | | |
| (after 30 days) | Good | Good | Excellent | Excellent | Excellent | Excellent | Excellent | | | |
| Izod impact strength (kg · cm/cm²) | 5.2 | 5.0 | 4.6 | 4.7 | 4.7 | 4.6 | 4.6 | Test specimen could not be formed | Test specimen could not be formed | Test Specimen could not be formed |
| Folding endurance | Good | Good | Good | Good | Good | Good | Good | — | — | Good |

As shown in Table 4, the cured products formed from the compositions obtained in Examples 8–14 exhibited high accuracy of fabrication, high modulus of elasticity, and excellent stability with time. Superior form stability of the cured products formed from the compositions was evident from small deformation (warping) caused by shrinkage during curing. Moreover, these cured products exhibited excellent impact resistance and high folding endurance.

Comparative Example 3, in which the component (A) was not blended and the component (C) was blended in the proportion greater than specified. Moreover, in the evaluation of the cured film, since the film prepared from the composition was brittle, a modulus of elasticity and folding endurance could not be measured.

Similar to the composition of Comparative Example 3, no three-dimensional object was formed from the composition of Comparative Example 4, in which the component (A) was not blended, due to insufficient curability. A modulus of elasticity and folding endurance could not be measured since the film prepared from the composition was brittle.

Although the composition of Comparative Example 5, in which the component (C) was not blended, exhibited good folding endurance, no three-dimensional object was formed from the composition because of inferior curability.

Examples 15–18

Transparent liquid compositions (the photocurable resin compositions of the present invention) were obtained in the same manner as in Example 1 except for the alteration of the formulations of the components (A)–(E) & (G) according to Table 5.

Comparative Examples 6–7

Transparent liquid compositions (photocurable resin compositions for comparison) were obtained in the same manner as in Example 1 except for the alteration of the formulations of each component according to 5 Table 5.

TABLE 5

|  | Examples | | | | Comparative Examples | |
|---|---|---|---|---|---|---|
|  | 15 | 16 | 17 | 18 | 6 | 7 |
| 3,4-epoxycyclohexylmethyl-3,4-epoxycyclohexanecarboxylate*[1] (component A) | 68 | 58 | 44 | 63 | 68 | 66 |
| Triallylsulfoniumhexafluoro-antimonate*[2] (component B) | 2 | 2 | 2 | 2 | 2 | 2 |
| Trimethylolpropane triacrylate*[3] (component C) | 10 | 10 | 10 | 5 | — | 10 |
| 1-hydroxycyclohexylphenyl ketone*[4] (component D) | 2 | 2 | 2 | 2 | 2 | 2 |
| PO-modified glycerol*[5] (component E) | 8 | 8 | 8 | 8 | 8 | — |
| EHPE3150*[6] (component G) | 10 | 20 | 34 | 20 | 20 | 20 |

*[1]Sunnix GP-250 (manufactured by Sanyo Chemical Industries, Ltd.)
*[2]EHPE3150 (manufactured by Daicel Chemical Industries, Ltd.)
*[3]UVR-6110 (manufactured by Union Carbide Corp.)
*[4]UVI-6974 (manufactured by Union Carbide Corp.)
*[5]Viscoat295 (manufactured by Osaka Organic Chemical Industry Co., Ltd.)
*[6]Irgacure 184 (manufactured by Ciba Specialty Chemicals Co., Ltd.)

Evaluation of Photocurable Resin Composition

Photocurability of the photocurable resin compositions obtained in Examples 15–18 and Comparative Examples 6–7 and heat resistance and accuracy of fabrication of the three-dimensional objects formed from these compositions were evaluated according to the following evaluation methods. The results are shown in Table 6.

Photocurability

Each composition was irradiated by using a photofabrication apparatus "Solid Creator JSC-2000" equipped with an argon ion laser (wavelength: 351 nm, 365 nm) (manufactured by SONY CORP.) as a light source. The laser beam was irradiated so that the intensity of the laser beam was 100 mW at the liquid surface while altering the scanning speed. The scanning speed when the thickness of the cured layer (hereinafter called "cure depth") was 0.3 mm (this speed is referred to as "optimum scanning speed") was determined. Evaluation of photocurability of the compositions was as follows.

optimum scanning speed was 20 cm/second or more: "◯"
  optimum scanning speed was 5–20 cm/second: "Δ"
  optimum scanning speed was 5 cm/second or less or cured layer was not formed: "X"

Heat-deformation Temperature

Three-dimensional objects (length: 120 mm, width: 11 mm, thickness: 4 mm) were formed from each composition by using the above photofabrication apparatus according to the following conditions (1)–(3)
(1) intensity of laser beam at the liquid surface: 100 mW
(2) scanning speed: optimum scanning speed at which the cure depth of each composition was 0.3 mm
(3) thickness of cured resin layer: 0.2 mm The resin compositions adhering to the surface of the resulting three-dimensional objects were wiped off and the objects were washed with a solvent. The objects were then annealed using a heating oven for about two hours at 100° C. to prepare test specimens used for measuring the heat-deformation temperature.

The heat-deformation temperatures of the test specimens thus prepared were measured according to JIS K7207 A.

Evaluation of Accuracy of Fabrication

As discussed above with respect to Examples 1–14. As shown in Table 6, the resin compositions obtained in Examples 15–18 exhibited superior curability, higher heat-deformation temperature, and higher accuracy of fabrication. With respect to the resin compositions of Comparative Examples 6 and 7, low curability of the compositions resulted in insufficient three-dimensional objects.

TABLE 6

|  | Examples | | | | Comparative Examples | |
|---|---|---|---|---|---|---|
|  | 15 | 16 | 17 | 18 | 6 | 7 |
| Curability | ◯ | ◯ | ◯ | ◯ | X | X |
| Heat-deformation temperature (° C.) | 120 | 128 | 135 | 125 | — | — |
| Accuracy of fabrication | ◯ | ⊙ | ◯ | ◯ | X | X |

Effect of the Invention

The cured product formed from the photocurable resin composition of the present invention exhibits small variation of mechanical properties with time, small deformation with time (warping), increased mechanical strength, high dimensional accuracy, and superior heat resistance. Said cured product can be used as three-dimensional objects, for example, a prototype of mechanical parts to which superior toughness such as high impact resistance and excellent folding endurance is required.

What is claimed is:

1. A photocurable resin composition comprising:
  (A) an epoxy compound having two or more alicyclic epoxy groups;

(B) a cationic photopolymerization initiator;

(C) a polyfunctional monomer having two or more ethylenically unsaturated groups in one molecule;

(D) a radical photpolymerization initiator;

(E) a polyol having three or more hydroxyl groups in one molecule; and (F) core shell particles having an average particle diameter of 10–700 nm, wherein said core shell particles include (i) a partially crosslinked core selected from the group consisting of polybutadiene, polyisoprene, styrene/butadiene copolymer, styrene/isoprene copolymer, ethylene/propylene copolymer, etbylene/α-olefin copolymer, ethylene/α-olefin/polyene copolymer, acrylic rubber, butadiene/(meth)acrylate copolymer, styrene/butadiene block copolymer, and styrene/isoprene block copolymer; and (ii) a shell selected from the group consisting of methyl methacrylate polymer and methyl methacrylate/glycidyl methacrylate copolymer.

2. The composition of claim 1, wherein said polyol is a polyether polyol.

3. The composition of claim 1, wherein at least 60 wt % of ethylenically unsaturated monomers present in said composition comprise three or more ethylenically unsaturated bonds.

4. The composition of claim 1, wherein at least 80 wt % of ethylenically unsaturated monomers present in said composition comprise three or more ethylenically unsaturated bonds.

5. The composition of claim 4, wherein said polyfunctional monomer is selected from the group consisting of trimethylolpropane tri(meth)acrylate, EO-modified trimethylolpropane tri(meth)acrylate dipentacrythritol hexa(meth)acrylate, dipentacrythritol penta(meth)acrylate, and ditrimethylolpropane tetra(meth)acrylate.

6. The composition of claim 1, wherein all ethylenically unsaturated monomers present in said composition comprise three or more ethylenically unsaturated bonds.

7. The composition of claim 1, wherein said composition comprises, relative to the total weight of the composition, 7–25 wt % of said polyfunctional monomer.

8. The composition of claim 7, wherein said composition comprises, relative to the total weight of the composition, 20–85 wt % of said epoxy.

9. The composition of claim 8, wherein said composition comprises, relative to the total weight of the composition, 5–35 wt % of said polyol.

10. The composition of claim 1, wherein said composition further comprises a diglycidyl ether compound.

11. The composition of claim 1, wherein said polyfunctional monomer is selected from the group consisting of trimethylolpropane tri(meth)acrylate, EO-modified trimethylolpropane tri(meth)acrylate, dipentacrythritol hexa(meth)acrylate, dipentacrythritol penta(meth)acrylate, and ditrimethylolpropane tetra(meth)acrylate.

12. The composition of claim 1, wherein said composition comprises, relative to the total weight of the composition, 7–35 wt % of said polyfunctional monomer.

13. The composition of claim 1, wherein said polyol has a molecular weight or 160–1000.

14. The composition of claim 1, wherein said polyol is selected from the group consisting of ethylene oxide modified trimethylolpropane, propylene oxide modified trimethylolpropane, propylene oxide modified glycerol, and propylene oxide modified sorbitol.

15. The composition of claim 1, wherein said partially crosslinked core is selected from the group consisting of polybutadiene, polyisoprene, styrene/butadiene copolymer, styrene/isoprene copolymer, butadiene/(meth)acrylate copolymer, styrene/butadiene block copolymer, and styrene/isoprene block copolymer.

16. The composition of claim 1, wherein said epoxy compound is selected from the group consisting of 3,4-epoxycyclohexylmethyl-3',4'-epoxycyclohexanecarboxylate and bis(3,4-epoxycyclohexylmethyl)adipate.

17. The composition of claim 1, wherein said composition comprises, relative to the total weight of the composition, 20–85 wt % of said epoxy compound;

0.1–10 wt % of said cationic photopolymerization initiator;

5–45 wt % or said polyfunctional monomer;

0.01–10 wt % of said radical photopolymerization initiator;

5–35 wt % of said polyol; and

1–35 wt % of said core shell particles.

18. The composition of claim 1, wherein the ratio of the core radius to the shell thickness of said core shell particles is in the range of 1/1–200/1.

19. A process for photo-fabricating a three-dimensional object comprising:

selectively curing a photo-curable resin according to claim 1.

20. A three-dimensional object formed by the process of claim 19.

* * * * *

UNITED STATES PATENT AND TRADEMARK OFFICE
CERTIFICATE OF CORRECTION

PATENT NO.   : 6,727,035 B2
DATED        : April 27, 2004
INVENTOR(S)  : Yamamura et al.

It is certified that error appears in the above-identified patent and that said Letters Patent is hereby corrected as shown below:

<u>Title page,</u>
Item [30], Foreign Application Priority Data, please correct the application number as follows:
-- Feb. 24, 1998   (JP) ............................... 98-058861 --

Signed and Sealed this

Eighth Day of March, 2005

JON W. DUDAS
*Director of the United States Patent and Trademark Office*